United States Patent
Diechle et al.

(10) Patent No.: US 11,326,248 B2
(45) Date of Patent: May 10, 2022

(54) PVD PROCESS FOR THE DEPOSITION OF $AL_2O_3$ AND A COATED CUTTING TOOL WITH AT LEAST ONE LAYER OF $AL_2O_3$

(71) Applicant: WALTER AG, Tubingen (DE)

(72) Inventors: Dominic Diechle, Herrenberg (DE); Veit Schier, Echterdingen (DE)

(73) Assignee: WALTER AG, Tubingen (DE)

( * ) Notice: Subject to any disclaimer, the term of this patent is extended or adjusted under 35 U.S.C. 154(b) by 21 days.

(21) Appl. No.: 16/761,867

(22) PCT Filed: Nov. 7, 2018

(86) PCT No.: PCT/EP2018/080459
§ 371 (c)(1),
(2) Date: May 6, 2020

(87) PCT Pub. No.: WO2019/092009
PCT Pub. Date: May 16, 2019

(65) Prior Publication Data
US 2021/0189548 A1     Jun. 24, 2021

(30) Foreign Application Priority Data

Nov. 7, 2017 (EP) .................................. 17200385

(51) Int. Cl.
*B23B 27/14*    (2006.01)
*C23C 14/08*    (2006.01)
(Continued)

(52) U.S. Cl.
CPC .......... *C23C 14/081* (2013.01); *B23B 27/148* (2013.01); *C23C 14/0057* (2013.01);
(Continued)

(58) Field of Classification Search
CPC ... B23B 27/14; B23B 27/148; B23B 2228/10; B23B 2228/105; C23C 14/081; C23C 14/35
(Continued)

(56) References Cited

U.S. PATENT DOCUMENTS 6,383,624 B1 * 5/2002 Soderberg ............. C04B 41/009
425/216
6,423,403 B2 * 7/2002 Schiller ................. C23C 14/081
428/325

(Continued)

FOREIGN PATENT DOCUMENTS

CN    105088163 A    11/2015
EP      2940178 A1    11/2015
(Continued)

OTHER PUBLICATIONS

Schutze et al "Pilsed plasam-assisted PVD sputter-deposited alumina thin films". Surface & Coating Technology 162 p. 174-182. (Year: 2003).*
(Continued)

*Primary Examiner* — Archene A Turner
(74) *Attorney, Agent, or Firm* — Corinne R. Gorski

(57) ABSTRACT

A coated cutting tool including a substrate and a single layer or multi-layer hard material coating is provided. The substrate is selected from cemented carbide, cermet, ceramics, cubic boron nitride (cBN), polycrystalline diamond, steel or high-speed steel. The hard material coating includes at least one layer of gamma-$Al_2O_3$, exhibiting particularly high hardness and reduced Young's modulus. The gamma-$Al_2O_3$ layer of the coated cutting tool is obtainable by means of a reactive magnetron sputtering process using at least one Al target, wherein the deposition is carried out using a reaction gas composition of argon (Ar) and oxygen ($O_2$) at a total reaction gas pressure within the range from at least 1 Pa to
(Continued)

at most 5 Pa, at an $O_2$ partial pressure within the range from 0.001 Pa to 0.1 Pa, and at a temperature within the range from 400° C. to 600° C.

17 Claims, 1 Drawing Sheet

(51) Int. Cl.
  *C23C 14/00*  (2006.01)
  *C23C 14/34*  (2006.01)
  *C23C 14/35*  (2006.01)
  *C23C 14/06*  (2006.01)

(52) U.S. Cl.
  CPC ...... *C23C 14/0641* (2013.01); *C23C 14/3485* (2013.01); *C23C 14/35* (2013.01); *B23B 2228/10* (2013.01); *B23B 2228/105* (2013.01)

(58) Field of Classification Search
  USPC .................................................. 428/336, 701
  See application file for complete search history.

(56) References Cited

U.S. PATENT DOCUMENTS

| | | | |
|---|---|---|---|
| 6,451,180 B1 * | 9/2002 | Schiller | C23C 14/0042 204/192.15 |
| 2014/0178659 A1 * | 6/2014 | Wu | C23C 28/42 428/216 |

FOREIGN PATENT DOCUMENTS

| | | |
|---|---|---|
| JP | 2005138211 A | 6/2005 |
| JP | 4398287 B2 | 1/2010 |

OTHER PUBLICATIONS

Cremer et al: "Comparative characterization of alumina coatings deposited by RF, DC and pulsed reactive magnetron sputtering", Surface and Coatings Technology, Elsevier BV, Amsterdam, NL. vol. 120-121, Nov. 1, 1999, pp. 213-218.

Bozkin et al: "Relation of hardness and oxygen flow of Al2O3 coatings deposited by reactive bipolar pulsed magnetron sputtering", Thin Solid Films, Elsevier, Amsterdam, NL, vol. 494, No. 1-2, Jan. 3, 2006, pp. 255-262.

* cited by examiner

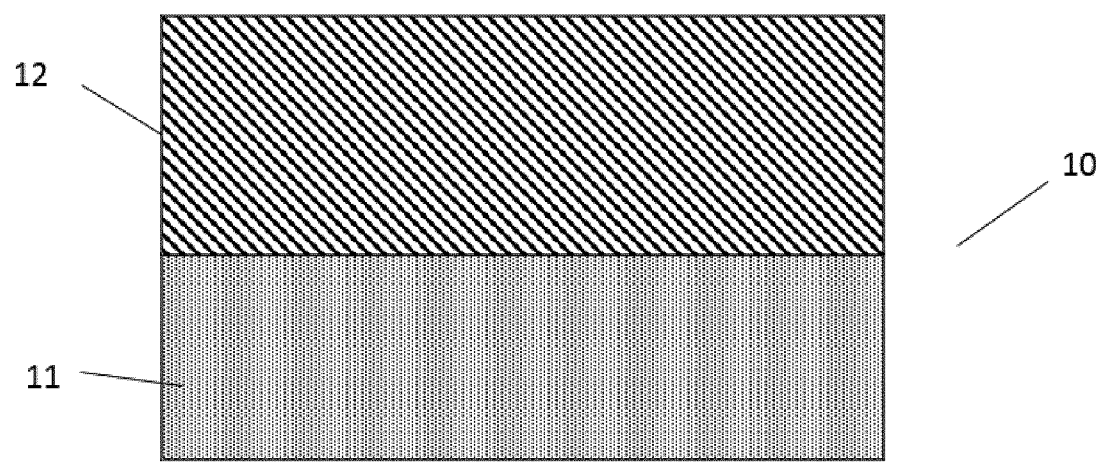

PVD PROCESS FOR THE DEPOSITION OF AL$_2$O$_3$ AND A COATED CUTTING TOOL WITH AT LEAST ONE LAYER OF AL$_2$O$_3$

RELATED APPLICATION DATA

This application is a § 371 National Stage Application of PCT International Application No. PCT/EP2018/080459 filed Nov. 7, 2018 claiming priority to EP 17200385.7 filed Nov. 7, 2017.

FIELD OF THE INVENTION

The present invention relates to a process for manufacturing of a coated cutting tool consisting of a substrate and a single layer or multi-layer hard material coating, the substrate being selected from cemented carbide (hard metal), cermet, ceramics, steel and high-speed steel, and the hard material coating comprising at least one layer of gamma-$Al_2O_3$. The present invention further relates to a respective coated cutting tool exhibiting improved hardness and improved reduced Young's modulus of the gamma-$Al_2O_3$ coating layer.

BACKGROUND OF THE INVENTION

Cutting tools used, for example, for metal-machining in general consist of a substrate (base body) of cemented carbide (hard metal), cermet, steel or high-speed steel, having a wear-resistant layer or a multi-layer coating of hard metallic substances, oxide layers and the like deposited thereon.

These coatings are applied using CVD (chemical vapour deposition) processes and/or PVD (physical vapour deposition) processes. In regard to the PVD processes a distinction is drawn between various variants, including cathode sputtering, arc vapour deposition (Arc-PVD), ion plating, electron beam vapour deposition and laser ablation.

Metal cutting tools having a coating comprising a hard alumina ($Al_2O_3$) layer have been commercially available for a long time. The thermal CVD technique usually employed for depositing these layers on the substrate surface involves the deposition of $Al_2O_3$ from a reactive gas atmosphere at elevated temperatures. The most often occurring $Al_2O_3$ phases (modifications) in conventional thermal CVD deposition processes are the thermodynamically most stable alpha-$Al_2O_3$ phase and the metastable kappa-$Al_2O_3$ phase.

The inherently high deposition temperature of the thermal CVD process in the order of about 1000° C. often causes the formation of cracks during cooling as a result of the tensile residual stress in the coating built up due to different thermal expansion coefficients between the alumina layer and the material below. These cracks deteriorate the performance of the cutting tool, especially at the cutting edge, e.g., in wet machining due to corrosive chemicals in the coolant fluid penetrating the coating through these cracks. Plasma-assisted CVD enables the deposition of alumina layers at lower temperatures as compared to thermal CVD, and thus, reduces the dominance of the thermal stresses. However, both of these CVD processes for depositing $Al_2O_3$, thermal CVD and plasma-assisted CVD, implicate the use of an Al halide, e.g., $AlCl_3$, and oxygen donors, e.g., $CO_2$, bringing about a chlorine content of up to 3.5 at-% within the $Al_2O_3$ layer, making the coating material non-optimized as a tool coating material.

In general, cathode sputtering techniques, such as magnetron sputtering, reactive magnetron sputtering and high power impulse magnetron sputtering (HIPIMS), and the arc evaporation belong to the PVD processes most frequently used for the deposition of hard coatings of cutting tools.

Early attempts to deposit $Al_2O_3$ layers by means of a PVD process at typical temperatures of about 400° C.-500° C. resulted in amorphous alumina layers, which did not offer any notable improvement in wear resistance when applied on cutting tools.

The cathode vacuum arc evaporation (Arc-PVD) of hard coating materials, including $Al_2O_3$, is characterized by a high rate of deposition, by dense layer structures due to the high ionization of the evaporated material, as well as by a good process stability. A substantial disadvantage, however, is the process-dependent deposition of micro particles (droplets) caused by the emission of small metal splashes, especially from targets of low-melting metals, such as aluminum. The droplets lead to an undesirably high surface roughness on the deposited layers, and the avoidance of droplet formation is complex.

In the cathode sputtering (sputtering) atoms or molecules are removed from the target by bombardment with high-energy ions and are transferred into the gas phase from which they are subsequently deposited on the substrate, either directly or after reaction with a reaction gas. The cathode sputtering being supported by magnetron comprises three essential process variants, the conventional unpulsed DC magnetron sputtering (DC-MS), pulsed DC magnetron sputtering and the high power impulse magnetron sputtering (HIPIMS) process. In the magnetron sputtering process the unfavorable formation of droplets does not occur. However, in general, the deposition rates of sputtering processes is low compared to Arc-PVD, thus, they require longer deposition times, which is an economic disadvantage.

When using HIPIMS the magnetron is operated in the pulsed mode at high current densities resulting in an improved coating structure of particularly dense layers due to an increased ionization of the sputtered material. In the HIPIMS process the current densities at the target typically exceed that of the conventional unpulsed or pulsed DC-MS.

Layers, including $Al_2O_3$ layers, deposited by means of unpulsed or pulsed DC-MS and HIPIMS, respectively, often exhibit considerable structural differences. DC-MS layers usually grow in a columnar structure, whereas in the HIPIMS process microcrystalline layer structures are obtained, being characterized by an improved wear behavior and longer service lives associated therewith in comparison to DC-MS layers. HIPIMS layers are usually harder than the columnar DC-MS layers, but they also show disadvantages with respect to their adhesion to many substrates.

With respect to pulsed DC-MS processes there is distinguished between unipolar and bipolar processes. The unipolar DC-MS process is less suitable for the deposition of insulating materials, such as $Al_2O_3$, since an electrical charge accumulates on the deposited insulating layer, which may then, when the charge is sufficiently high, discharge through the layer, a phenomenon also called "arcing". The process of bipolar pulsed dual magnetron sputtering (dMS) enables the deposition of insulating layers, such as $Al_2O_3$, and, in particular, the deposition of crystalline $Al_2O_3$ layers at substrate temperatures in the range of 500° C. to 800° C. In the bipolar dual magnetron sputtering, two magnetrons alternately act as an anode and a cathode and, hence, preserve a metallic anode over a longer period. At high enough frequencies, possible electrical charging on the insulating layers is suppressed and the phenomenon of "arcing" is reduced.

Cremer R. et al., "Comparative characterization of alumina coatings deposited by RF, DC and pulsed reactive magnetron sputtering", Surface and Coatings Technology, vol. 120-121, November 1999, pages 213-218, describe investigations on the structure of PVD alumina coatings as a function of substrate temperature and deposition conditions. $Al_2O_3$ films were deposited by reactive magnetron sputtering at deposition temperatures between 100° C. and 600° C. on cemented carbide and high speed steel substrates using aluminum targets, which were sputtered in an argon-oxygen plasma in RF, DC and pulsed mode, respectively. The influence of deposition temperature and sputtering conditions upon the crystal structure of the films has been investigated by X-ray diffraction, the hardness by microindentation. Furthermore, a correlation between film growth rate and oxygen partial pressure has been determined. The analyses revealed that the oxygen partial pressure during film deposition had strong influence on the resulting deposition rate and crystallinity, which is also significantly influenced by the deposition temperature. The process window for the deposition of crystalline coatings was found to be very narrow for DC sputtering, while it is larger with RF and pulsed plasma sources. Depending on the process parameters, oxygen partial pressure and plasma source, amorphous or crystalline gamma-$Al_2O_3$ films with thicknesses in the range from 1 to 8 μm and hardness values up to 25 GPa (corresponding to a Vickers hardness of 2550 HV) have been deposited. Very low oxygen partial pressures led to the co-deposition of aluminum, while none of the chosen process parameters resulted in the formation of crystalline alpha-$Al_2O_3$. The Ar partial pressure applied in the depositions was 0.35 Pa.

Bobzin K. et al., "Relation of hardness and oxygen flow of $Al_2O_3$ coatings deposited by reactive bipolar pulsed magnetron sputtering", Thin Solid Films, vol. 494, issue 1-2, pages 255-262, describe investigations about the influence of deposition parameters on the properties of alumina films. Different alumina structures were deposited by means of reactive bipolar pulsed magnetron sputtering. In order to find the appropriate parameter combination to synthesize crystalline gamma-$Al_2O_3$, substrate temperature, power density at the target and oxygen flow were varied. The gamma-$Al_2O_3$ films were synthesized at 650° C., a pressure of 0.2 Pa, 800 W, 1:4 duty cycle, 19.2 kHz, and 11-12% oxygen flow. The structure and morphology of the deposited $Al_2O_3$ films were characterized by X-ray diffractometry (XRD) and scanning electron microscopy (SEM). The influence of the oxygen flow on the alumina hardness was investigated, and it was observed that the hardness and the structure of the PVD deposited alumina coatings were significantly oxygen flow dependent, and it varied between 1 and 25.8 GPa (corresponding to a Vickers hardness between about 100 HV and about 2630 HV). The hardness increased by increasing oxygen flow until the target reached the poisoned state, where a hardness reduction was clearly observed.

Summarizing, the prior art PVD techniques generally applied for the deposition of $Al_2O_3$ coating layers, especially gamma-$Al_2O_3$ provide a hardness of the coating layers up to about 2650 HV, at most about 2800 HV, but in many cases the hardness is far below these values. Attempts to increase the hardness of the $Al_2O_3$ coatings resulted in a drastic decrease of the deposition rate and/or poisoning of the PVD targets. Furthermore, the reduced Young's modulus measured on $Al_2O_3$ coating layers deposited by conventional PVD techniques reaches up to about 340 GPa, but in many cases the reduced Young's modulus is far below these values. Therefore, it would be desired to provide hard $Al_2O_3$ coating layers, especially gamma-$Al_2O_3$, of higher hardness and reduced Young's modulus to improve the wear resistance and cutting properties of the cutting tools.

Another disadvantage of the deposition of hard coatings by means of PVD technique, compared to CVD technique, is that the coating layers are non-uniformly deposited on the substrate. The reason for the non-uniform distribution of the layer thicknesses resulting from PVD deposition is that the targets are mounted at the side walls of the reactor, and the atoms, ions or molecules released from the targets are accelerated towards the substrate essentially in one single direction and are deposited on the substrate surface essentially facing towards the respective target. In order to still provide a more even distribution of the deposited layer on the substrate, the substrate is rotated about two or three axes, herein called "two-fold rotated" or "three-fold rotated", respectively. However, even when using three-fold rotation, all of the rotations are within the same plane, and thus, all of the surfaces of the substrate being arranged essentially parallel to the direction from the target to the substrate, will have a substantially lower coating thickness compared to those substrate surfaces being arranged substantially perpendicular to the direction from the target to the substrate. In a PVD coating arrangement of indexable cutting tool inserts, the rake faces are usually arranged perpendicular to the rotation axes, and the flank faces are arranged essentially parallel to the rotation axes. Thus, the rake faces of cutting inserts will usually receive a lower coating thickness in PVD coatings than the flank faces.

A further reason for the non-uniform distribution of the layer thicknesses in a PVD deposition is the distribution of the (rotated) substrates within the reaction chamber. In general, the targets are mounted in the reaction chamber on or parallel to the side walls of the reaction chamber. Therefore, the lower surfaces of those substrates being arranged on the lowermost level within the reaction chamber and the upper surfaces of those substrates being arranged on the uppermost level within the reaction chamber will receive the lowest coating thicknesses compared to the remaining surfaces of the same substrate and compared to the surfaces of the substrates being arranged more in the middle part of the reaction chamber.

Thus, the PVD deposition of hard coatings on cutting tool substrates suffers from an uneven coating thickness distribution on different substrate surfaces.

OBJECT OF THE INVENTION

It is an object of the present invention to provide a coated cutting tool comprising a gamma-$Al_2O_3$ coating layer with improved hardness and improved reduced Young's modulus as well as an improved coating thickness distribution of the gamma-$Al_2O_3$ layer on the substrate surfaces over the prior art.

DESCRIPTION OF THE INVENTION

This object is attained by a process for manufacturing of a coated cutting tool consisting of a substrate and a single layer or multi-layer hard material coating, the substrate being selected from cemented carbide, cermet, ceramics, cubic boron nitride (cBN), polycrystalline diamond (PCD), steel or high-speed steel (HSS), and the hard material coating comprising at least one layer of gamma-$Al_2O_3$ being deposited by means of a reactive magnetron sputtering process using at least one Al target, wherein the deposition is carried out
    using a reaction gas composition comprising or consisting of argon (Ar) and oxygen ($O_2$) and
    at a total reaction gas pressure within the range from at least 1 Pa to at most 5 Pa,
    at an $O_2$ partial pressure within the range from 0.001 Pa to 0.1 Pa,
    at a temperature within the range from 400° C. to 600° C.

A coating layer is considered a "gamma-$Al_2O_3$" coating layer in the sense of the present invention, if the X-ray diffraction pattern (XRD) of the coating layer, measured at a grazing angle of 1°, exhibits a peak pattern predominantly of the peaks of the cubic gamma phase of $Al_2O_3$ according to JCPDS No. 10-425 of the ICDD database, especially the characteristic (222), (400) and (440) peaks of gamma-$Al_2O_3$, and no or substantially no reflections of other $Al_2O_3$ modifications within the same coating layer.

It has surprisingly been found that the gamma-$Al_2O_3$ layers produced according to the process of the present invention exhibit significantly higher hardness values than known gamma-$Al_2O_3$ coatings obtained by prior art PVD processes. And, at the same time, the gamma-$Al_2O_3$ layers produced according to the process of the present invention exhibit a reduced Young's modulus which is at least as high or even higher than it was known from the prior art.

Furthermore, it was surprisingly found that the process of the present invention provides a significantly more even coating thickness distribution of the gamma-$Al_2O_3$ layer on the different surface areas of the cutting tool substrate than it is obtained by prior art processes. In the present case, the evenness of the coating thickness distribution was determined by the ratio of the layer thickness on the rake face (RF) to the layer thickness on the flank face (FF) of indexable cutting inserts, which were mounted to a two-fold or three-fold rotated plate in the PVD reaction chamber. The way how the inserts are mounted in the reaction chamber, i.e., the flank faces oriented essentially parallel to the axis of rotation and to the targets and the rake faces oriented essentially perpendicular to the axis of rotation and to the targets, in general, results in thicker coatings on the flank faces than on the rake faces, thus, the thickness ratio RF/FF<1. A comparison between the thicknesses of gamma-$Al_2O_3$ coating layers obtained by the process of the present invention and prior art processes under comparable conditions showed that the thickness ratio RF/FF obtained according to the process of the present invention was at least 10% higher (=towards a more even thickness distribution between rake face and flank face) than the thickness ratios RF/FF obtained by the prior art process.

In terms of the present invention, the total reaction gas pressure essentially corresponds to and is almost as high as the Ar partial pressure, since the $O_2$ partial pressure is comparably low, thus, the total gas pressure is dominated by the Ar partial pressure. Therefore, if herein reference is made to the Ar partial pressure, it means essentially the total pressure of the reaction gas or, to be more precise, the total pressure minus the $O_2$ partial pressure, the latter being low compared to the Ar partial pressure.

In general, a certain Ar partial pressure is necessary to achieve the required ionization of the target material and to obtain crystalline $Al_2O_3$ depositions at reasonable deposition rates. However, as it is also generally known, an increase of the Ar partial pressure generally results in a higher probability of collisions of the atoms or ions, which in turn leads to a decrease of their energy and a drastic reduction of the deposition rate. Therefore, a reduced hardness of the coating would be expected due to the reduced energy of the layer-forming atoms.

Regarding the reasons for the improved thickness distribution observed with the process of the present invention, without being bound by theory, the inventors assume that the improvement is obtained since the process of the present invention broadens the scattering angle of the atoms, ions or molecules being accelerated from the target towards the substrates, and that the invention provides a more even energy distribution of the atoms, ions or molecules within this scattering angle.

In addition to the improved hardness, improved reduced Young's modulus and improved thickness distribution, it has surprisingly been found that, despite the high total pressure or Ar partial pressure, respectively, the gamma-$Al_2O_3$ deposition rates of the process of the present invention can still be held within a reasonable and economically feasible range of from 0.4 μm/h to 1.1 μm/h, as measured on a three-fold rotated substrate on the flank face (FF). Even though the deposition rate decreases with increasing total pressure or Ar partial pressure, respectively, the observed decrease of the deposition rate was much less than expected. For example, at certain deposition conditions, a deposition rate of 0.55 μm/h at 1 Pa total pressure was observed, and at 2 Pa total pressure the deposition rate still was 0.48 μm/h, and at 4 Pa total pressure the deposition rate still was 0.43 μm/h on a three-fold rotated substrate on the flank face (FF).

It was further surprising that the gamma-$Al_2O_3$ coating layers deposited by the process of the present invention showed an improved fracture toughness compared to layers deposited according to the prior art under similar conditions. For example, in a fracture test, for inventive coatings deposited at total pressures of 1 Pa and 2 Pa, respectively, fracture lengths of about 51 μm were measured, whereas a prior art coating deposited at 0.47 Pa total pressure and otherwise comparable conditions exhibited a fracture length of about 55 μm, which is more than 7% higher than the value obtained applying the present invention.

The PVD method of the process of the present invention is reactive pulsed magnetron sputtering. In a preferred embodiment of the present invention the process used is reactive pulsed dual magnetron sputtering. In another preferred embodiment of the present invention the process used is reactive bipolar pulsed magnetron sputtering or HIPIMS, wherein the pulse frequency is preferably within the range from 20 kHz to 100 kHz.

In the PVD deposition process according to the present invention the substrate to be coated, especially if the cutting tool is a cutting insert, is preferably arranged in the reaction chamber, such that the rake face of the cutting tool is oriented essentially perpendicular to the target surface or, expressed elsewise, the substrate to be coated is arranged in the reaction chamber, such that the rake face is essentially parallel to the direction from the target to the substrate.

In the PVD deposition process according to the present invention the substrate to be coated is preferably rotated on a two-fold or three-fold axis during the deposition of the gamma-$Al_2O_3$ layer to ensure an as even as possible coating thickness distribution over the surfaces of the substrate.

In an embodiment of the invention the magnetron target power density is from 4 W/$cm^2$ to 20 W/$cm^2$, preferably from 6 W/$cm^2$ to 13 W/$cm^2$, to obtain an economically feasible deposition rate and, at the same time, stable process conditions. If the magnetron target power density is too low, the deposition rate will be low, however, if the magnetron target power density is too high, the targets may become too hot and the necessary cooling of the targets may not be guaranteed.

In another embodiment of the invention, the pulsed bias voltage is from 80 V to 200 V, preferably from 100 V to 180 V, particularly preferably from 125 V to 165 V. It has been shown, that in particular when using the pulsed bias voltage within this range, gamma-$Al_2O_3$ layers are obtained having a Vickers hardness in the range of at least 3000 HV up to 3300 HV or even up to 3500 HV and a reduced Young's modulus in the range of at least 350 GPa up to 370 GPa or even up to 390 GPa. If the pulsed bias voltage is too low, the portion of amorphous $Al_2O_3$ in the deposited layer increases, which in turn reduces the hardness and the reduced Young's modulus. If the pulsed bias voltage is too high, the deposition rate will decrease.

In the process of the present invention the $O_2$ partial pressure can be measured by using a lambda oxygen sensor, whereas a direct measurement of the Ar partial pressure is not possible. However, if only $O_2$ and Ar are introduced, the Ar partial pressure is obtained by measuring the total pressure, and then the Ar partial pressure is the difference between the total pressure and the $O_2$ partial pressure. Herein, the total pressure of the reaction gas in the reactor is measured by means of a Baratron®-Direct (Gas Independent) Pressure/Vacuum Capacitance Manometer, MKS Instruments.

In reactive magnetron sputtering the deposition takes place at an "operating point" somewhere between "metallic mode" and "completely poisoned mode".

In general, in PVD processes of the type of the present invention it is observed that, at an early stage of the deposition process, the $O_2$ and Ar partial pressures may change at constant $O_2$ and Ar flows, due to the known phenomenon that, at the early stage of the process, oxidation processes occur at the oxidizable surfaces of parts of equipment, including the targets, within the reactor, called poisoning, leading to a fast consumption of $O_2$.

The oxygen flow during the deposition process is suitably controlled by increasing it to a very high level during the first seconds of the deposition process to achieve the desired value of oxygen partial pressure or cathode voltage right from the beginning. In reality this poisoning process is more or less completed only a short time into the deposition process. Then the intense control activity calms down and the changes in oxygen flow will decrease more and more. However, there will be an ongoing slow drift in flow until the end of the deposition process.

Thus, while the oxidation process of the parts in the reactor advances and the unoxidized surface area of oxidizable parts in the reactor decreases, the $O_2$ partial pressure, and thus the total pressure, increase until the partial pressure of $O_2$ becomes stable after a certain time, i.e. when the oxidation of the parts has reached an advanced stage, where no significant amounts of oxidizable parts of the reactor are left. Therefore, in the context of the present invention $O_2$ partial pressure indications mean the $O_2$ partial pressure at the stabilized stage of the process.

Using a constant flow of oxygen through the process, as in several prior art disclosures, will not result in a homogenous coating. Only by controlling the position of the operating point allows for providing homogenous coatings with the best mechanical properties (very high hardness and high elastic modulus).

One can distinguish between three modes for an "operating point" to carry out the deposition process. The first mode is the metallic mode, where you have not enough oxygen to reach an oxide coating (too low oxygen partial pressure or not measurable, the cathode voltage being very high). In this metallic mode the deposited coating has a quite low hardness, 2000 HV or lower. The second mode is the intermediate mode, where you have already measurable oxygen partial pressure (within the claimed range of the invention), the cathode voltage is in a range (about 300V up to about 400V) between metallic (i.e. about 700V) and poisoned mode (cathode voltage roughly 200V). The deposited coating in this intermediate mode is hard. The third mode is the poisoned mode, the cathode voltage is low, near 200V. The coating in this poisoned mode is hard but the sputter rate low to zero. With falling cathode voltage one loses sputter rate. So it is very important to choose an operating point in the intermediate mode near to the metallic mode (for high sputter rate) but still far enough into the mode to get an oxide coating with high hardness.

For any PVD system the general procedure for finding a suitable operating point is to measure the cathode voltage behavior and partial pressure/total pressure through stepwise increasing oxygen flow [sccm] until the system is completely poisoned and then decrease the oxygen flow until 0 sccm again.

One can choose to control the deposition process by adjusting the oxygen flow (affecting the oxygen partial pressure and indirectly the cathode voltage), but never by using a fixed oxygen flow during the deposition process. The operating point is not a stable point, so it has to be continuously controlled (with oxygen flow) in a very fast way and during the whole process.

On the other hand, if a fixed oxygen flow is used through the whole deposition process the coating will be sputtered from the beginning with an operating point in metallic mode and then, depending on the equipment and conditions in the chamber, the operating point will completely stay in a metallic mode or will drift into a completely poisoned mode.

Thus, the process of the present invention preferably comprises controlling the flow of oxygen during the deposition process. The control of the flow of oxygen leads to a control of both the level of $O_2$ partial pressure during the deposition process and that the cathode voltage is kept at a desired level during the deposition process. Suitably the controlling of the flow of oxygen during the deposition process is made in order to provide a substantially constant cathode voltage and/or substantially constant oxygen partial pressure.

In the process of the present invention the operating point is suitably neither in a metallic mode nor in a completely poisoned mode.

The most suitable "operating point" to carry out the deposition process of the present invention may vary from one PVD system to another. Therefore, the suitable operating point may have to be adjusted for a particular system in respect of reaction gas flows and cathode voltage to work in a region that leads to the deposition of a high quality gamma-$Al_2O_3$ coating at a reasonable rate.

In another embodiment of the invention, the bias current in the process is from 20 A to 60 A, preferably from 26 A to 50 A, particularly preferably from 27 A to 45 A. If the bias current is too low, the portion of amorphous $Al_2O_3$ in the deposited layer increases, which in turn reduces the hardness and the reduced Young's modulus. If the pulsed bias voltage is too high, the deposition rate will decrease, and a too high bias current may as well lead to process instabilities, such as arcing on the substrate table by spontaneous discharging.

In a preferred embodiment of the process of the present invention, the reaction gas mixture consists only of $O_2$ gas and Ar gas.

In another embodiment of the process of the present invention, a portion or all of the $O_2$ gas in the reactive gas composition may be replaced by a nitrogen and oxygen containing gas, selected from nitrous oxide, $N_2O$, nitric oxide, NO, nitrogen dioxide, $NO_2$, and dinitrogen tetroxide, $N_2O_4$. As long as sufficient oxygen is present, a pure gamma-$Al_2O_3$ will be produced due to the enthalpy of formation of the oxide compared to the enthalpy of formation of the nitride or oxynitride. The required amounts can easily be determined by the skilled person.

The present invention further relates to a coated cutting tool consisting of a substrate and a single layer or multi-layer hard material coating, the substrate being selected from cemented carbide, cermet, ceramics, cubic boron nitride (cBN), polycrystalline diamond (PCD), steel or high-speed steel (HSS), and the hard material coating comprising at least one layer of gamma-$Al_2O_3$, wherein the at least one layer of gamma-$Al_2O_3$ is deposited by the process of the present invention as described herein.

As described herein, the inventive process results in numerous structural and physical product properties of the gamma-$Al_2O_3$ coating layer, that have not been observed in a PVD deposited gamma-$Al_2O_3$ layer before. As stated above, first, a PVD deposited alumina layer generally distinguishes from a CVD deposited alumina layer due to the different deposition methods. But, the PVD deposited gamma-$Al_2O_3$ layer also distinguishes from alumina layers deposited by other PVD methods, such as for example Arc-PVD methods, and the inventive gamma-$Al_2O_3$ layer also distinguishes in respect of structural and physical properties from known gamma-$Al_2O_3$ layers deposited according to the prior art. As discussed above, the inventive reactive magnetron sputtering process results in product properties, which distinguish the inventive coating from the gamma-$Al_2O_3$ layers produced by other reactive magnetron sputtering processes using, for example, lower total pressure of the reaction gas or lower Ar partial pressure, respectively, and/or using no control of the oxygen flow during the deposition of gamma-$Al_2O_3$. These properties are, for example, higher hardness, higher reduced Young's modulus, higher fracture toughness, improved coating thickness distribution etc. These properties are necessarily the result of structural differences that are obtained by the inventive process over the prior art.

The present invention further relates to a coated cutting tool consisting of a substrate and a single layer or multi-layer hard material coating, the substrate being selected from cemented carbide, cermet, ceramics, cubic boron nitride (cBN), polycrystalline diamond (PCD), steel or high-speed steel (HSS), and the hard material coating comprising at least one layer of gamma-$Al_2O_3$, wherein the gamma-$Al_2O_3$ layer has a Vickers hardness HV(0.0015) of 3000 HV to 3500 HV, preferably 3000 HV to 3300 HV. These hardness values are significantly above the values that have been observed in known gamma-$Al_2O_3$ layers deposited in a reactive PVD process, which are usually in the range of 2600 HV to 2800 HV.

In another preferred embodiment of the coated cutting tool according to the invention, the gamma-$Al_2O_3$ layer has a reduced Young's modulus of 350 GPa to 390 GPa, preferably >350 GPa to 370 GPa. These values are significantly above the values of previously known gamma-$Al_2O_3$ layers deposited by PVD processes, which are generally lower in the range of up to about 340 GPa.

In an embodiment, the substrate of the coated cutting tool of the present invention is cemented carbide, preferably a cemented carbide having a composition of 6 to 14 wt % Co, optionally up to 10 wt % carbides or carbonitrides of one or more metals from groups 4, 5 and 6 of the periodic table of elements, and balance WC. The metals from groups 4, 5 and 6 of the periodic table of elements are suitably selected from the group consisting of Ti, Ta, Nb, V, Zr, Cr, W and Mo.

In a preferred embodiment of the coated cutting tool of the present invention, wherein the substrate is cemented carbide, the average grain size "d" of the WC in the cemented carbide body is in the range from 0.2 to 5 μm, preferably from 0.5 to 2 μm. The WC grain size in the cemented carbide substrate is herein determined from the value of the measured magnetic coercivity, and the relationship between the measured coercivity and grain size of WC is described, e.g., in Roebuck et al., Measurement Good Practice No. 20, National Physical Laboratory, ISSN 1368-6550, November 1999, Revised February 2009, Section 3.4.3, pages 19-20. For coercivity measurements it is referred to standard DIN IEC 60404-7. For the purposes of this application the grain size of the WC, d, is determined according to formula (8) on page 20 in the above-mentioned literature:

$$K=(c_1+d_1 W_{Co})+(c_2+d_2 W_{Co})/d, \text{ i.e.}$$

$$d=(c_2+d_2 W_{Co})/(K-(c_1+d_1 W_{Co})), \text{ wherein}$$

d=WC grain size of the cemented carbide body,
K=coercivity of the cemented carbide body in kA/m,
$W_{Co}$=wt % Co in the cemented carbide body,
$c_1$=1.44, $c_2$=12.47, $d_1$=0.04, and $d_2$=−0.37.

In an embodiment of the present invention, at least one gamma-$Al_2O_3$ layer is deposited directly onto the surface of the substrate.

In another embodiment of the present invention, at least one further layer of a nitride, carbide, carbonitride or boride of an element, selected from the group, consisting of Ti, Al, Cr, Si, V, Nb, Ta, W, Zr and Hf, is deposited between the surface of the substrate and the at least one gamma-$Al_2O_3$ layer. At least one additional layer between the substrate and the at least one gamma-$Al_2O_3$ layer has been shown to increase the adhesion of the overall coating to the substrate. Preferred base layers between the substrate and the at least one gamma-$Al_2O_3$ layer are selected from the group, consisting of TiAlN, AlCrN, TiC, TiCN and $TiB_2$.

In another embodiment of the present invention, at least one further layer of a nitride, carbide, carbonitride or boride of an element, selected from the group, consisting of Ti, Al, Cr, Si, V, Nb, Ta, W, Zr and Hf, is deposited on top of the at least one gamma-$Al_2O_3$ layer. At least one additional hard layer on top of the at least one gamma-$Al_2O_3$ layer is suitable to further improve wear resistance of the coated cutting tool.

In another embodiment of the present invention, the at least one gamma-$Al_2O_3$ layer is the outermost layer of the coating of the coated cutting tool, and in another embodiment of the present invention, at least one further wear resistant and/or decorative layer of a nitride, carbide, carbonitride or boride of an element, selected from the group, consisting of Ti, Al, Cr, Si, V, Nb, Ta, W, Zr and Hf, is deposited on top of the gamma-$Al_2O_3$ layer. Preferred layers are selected from the group, consisting of TiAlN, AlCrN, CrN, TiC, TiN, TiCN and $TiB_2$.

In an embodiment of the present invention, the coating of the coated cutting tool comprises two or more of the at least one gamma-$Al_2O_3$ layers, as defined herein and being deposited by the inventive deposition process. The two or more of the at least one gamma-$Al_2O_3$ layers may be deposited immediately on top of each other. However, in a preferred embodiment each of the two or more of the at least one gamma-$Al_2O_3$ layers is separated from the next of the two or more of the at least one gamma-$Al_2O_3$ layers by at least one separating layer of nitride, carbide, carbonitride or boride layer of one or more elements, selected from the group, consisting of Ti, Al, Cr, Si, V, Nb, Ta, W, Zr and Hf.

In an embodiment of the present invention the at least one gamma-$Al_2O_3$ layer has a thickness in the range from 0.3 µm to 20 µm, preferably from 0.5 µm to 10 µm, more preferably from 0.6 µm to 2 µm.

Too low thicknesses are difficult to produce, and the effect of the beneficial properties of the layer would not be realized. If the layer has a too large thickness, especially larger than 20 µm, the compressive residual stress of the layer will become too high leading to chipping and spalling of the layer and to impaired adhesion.

In another embodiment of the coated cutting tool of the present invention the at least one layer of gamma-$Al_2O_3$ is deposited by the process of the present invention as described herein.

Further features and advantages of the present invention will become apparent from the following description of non-limiting examples and embodiments of the present invention.

Methods

XRD (X-Ray Diffraction)

XRD measurements were done on a XRD3003 PTS diffractometer of GE Sensing and Inspection Technologies using CuKα-radiation. The X-ray tube was run in point focus at 40 kV and 40 mA. A parallel beam optic using a polycapillary collimating lens with a measuring aperture of fixed size was used on the primary side whereby the irradiated area of the sample was defined in such manner that a spill over of the X-ray beam over the coated face of the sample is avoided. On the secondary side a Soller slit with a divergence of 0.4° and a 25 µm thick Ni $K_\beta$ filter were used. The measurements were carried out over the range of 15 to 80° 2-theta with a step size of 0.03°. Grazing-incidence X-ray diffraction technique under 1° incidence angle was employed to study the crystal structure of the layers.

Vickers Hardness:

The Vickers hardness was measured by means of nano indentation (load-depth graph) using a Picodentor HM500 of Helmut Fischer GmbH, Sindelfingen, Germany. For the measurement and calculation the Oliver and Pharr evaluation algorithm was applied, wherein a diamond test body according to Vickers was pressed into the layer and the force-path curve was recorded during the measurement. The maximum load used was 15 mN (HV 0.0015), the time period for load increase and load decrease was 20 seconds each and the holding time (creep time) was 10 seconds. From this curve hardness was calculated.

Reduced Young's Modulus

The reduced Young's modulus (reduced modulus of elasticity) was determined by means of nano-indentation (load-depth graph) as described for determining the Vickers hardness.

Thickness:

The thickness of the coating layers was determined by calotte grinding. Thereby a steel ball was used having a diameter of 30 mm for grinding the dome shaped recess and further the ring diameters were measured, and the layer thicknesses were calculated therefrom. Measurements of the layer thickness on the rake face (RF) of the cutting tool were carried out at a distance of 2000 µm from the corner, and measurements on the flank face (FF) were carried out in the middle of the flank face.

EDX (Energy-Dispersive X-Ray Spectroscopy)

EDX measurements for atomic content determination within the layer were carried out on a scanning electron microscope Supra 40 VP from Carl Zeiss at 15 kV acceleration voltage with an EDX spectrometer of the type INCA x-act from Oxford Instruments, UK.

PVD Coating

For PVD coatings, as described in the examples herein, a Hauzer HTC1000 (IHI Hauzer Techno Coating B.V., The Netherlands) was used.

BRIEF DESCRIPTION OF THE DRAWINGS

FIG. 1 illustrates a coated substrate.

DETAILED DESCRIPTION

Referring to FIG. 1, the coated substrate 10 comprises a substrate 11 and a coating 12 deposited thereon. The coating 12 includes at least one gamma-Al2O3 layer.

Example 1—Deposition of Gamma-$Al_2O_3$ Coating Layers According to the Invention and Comparative Coatings In the following examples of the preparation of cutting tools according to the present invention and of comparative examples cemented carbide cutting tool substrate bodies (composition: 12 wt-% Co, 1.6 wt-% (Ta, Nb)C, balance WC; WC grain size: 1.5 µm; geometry: ADMT160608R-F56); were coated by bipolar pulsed magnetron sputtering in a PVD system as indicated above.

Prior to the deposition, the installation was evacuated to $8 \times 10^{-5}$ mbar, and the substrates were pre-treated at 550° C. For the depositions of $A_2O_3$, two Al-targets (800 mm×200 mm×10 mm each) were used and a dual magnetron was applied. The bias power supply was used in a bipolar pulsed mode with 45 kHz and an off-time of 10 ms. The magnetron power supply was pulsed with 60 kHz (±2 kHz), and the pulse form was sinus shape. The cathode voltage at the stabilized stage of the process was 390 V. Each of the depositions experiments was carried out with three-fold rotated substrates. The essential deposition parameters and measurement results (measured on products positioned in the middle of the reactor height) are indicated in the following table 1.

TABLE 1

| Sample # | 1 (Inv.) | 2 (Inv.) | 3 (Inv.) | 4 (Inv.) | 5 (Comp.) |
|---|---|---|---|---|---|
| Ar flow [sccm] | 1220 | 2255 | 1915 | 1220 | 500 |
| $O_2$ flow [sccm] | 101 | 104 | 101 | 156 | 105 |
| Total pressure [mPa] | 1000 | 2070 | 4180 | 1000 | 450 |
| $O_2$ part. press. [mPa] | 10.2 | 6.8 | 6.1 | 18.1 | 8.0 |
| Bias current [A] | 35.3 | 28.0 | 24.0 | 58.0 | 30.8 |
| Bias voltage [V] | 125 | 125 | 125 | 165 | 125 |
| Magnetron target power [kW] | 20 | 20 | 20 | 39 | 20 |
| Magnetron target power density [W/cm$^2$] | 6.2 | 6.2 | 6.2 | 12.2 | 6.2 |
| Coil current [A] | 4.5 | 4.0 | 5.0 | 2.5 | 6.5 |
| Deposition time [min] | 90 | 120 | 120 | 90 | 90 |
| Deposition rate [µm/h] | 0.55 | 0.48 | 0.43 | 0.73 | 0.55 |

TABLE 1-continued

| Sample # | 1 (Inv.) | 2 (Inv.) | 3 (Inv.) | 4 (Inv.) | 5 (Comp.) |
|---|---|---|---|---|---|
| Thickness [μm] | 0.82 | 0.96 | 0.86 | 1.1 | 0.83 |
| Vickers Hardness [HV] | 3112 | 3120 | 3002 | 3164 | 2792 |
| Reduced Young's modulus [GPa] | 381 | 361 | 368 | 367 | 340 |

XRD measurements on the samples prepared according to the invention and on the comparative sample showed only peaks of gamma-$Al_2O_3$ phase.

Example 2—Comparison of the Layer Thicknesses

The following table 2 shows the ratios of the measured layer thicknesses on the rake face (RF) and on the flank face (FF) [ratio RF/FF] of samples produced as described for sample #1 (invention) and sample #5 (comparative example) in example 1, respectively. The ratios RF/FF were measured on samples positioned at the top position, the middle position and the bottom position within the PVD reactor. Thereby, the layer thicknesses on the rake face (RF) were measured on the upper rake face for the samples at the top and middle positions in the reactor, whereas the layer thickness on the rake face (RF) of the sample at the bottom position of the reactor was measured on the lower rake face.

TABLE 2

| Sample according to | Reactor position | layer thickness RF [μm] | layer thickness FF [μm] | ratio RF/FF |
|---|---|---|---|---|
| #1 (Inv.) | top | 0.38 | 0.69 | 0.55 |
| | middle | 0.62 | 0.82 | 0.77 |
| | bottom | 0.37 | 0.62 | 0.60 |
| #5 (Comp.) | top | 0.28 | 0.62 | 0.45 |
| | middle | 0.57 | 0.83 | 0.69 |
| | bottom | 0.27 | 0.64 | 0.43 |

The obtained results show that the thickness ratio RF/FF obtained according to the process of the present invention was at least 10% higher than obtained by the prior art process, i.e., a more even thickness distribution between rake face and flank face was obtained by the inventive process, independent of the position of the samples within the reactor.

Example 3—Cutting Tests on Multi-Layer Coated Cutting Tools

In order to assess the effect of the $Al_2O_3$ layer according to the invention, compared to conventional coating, with respect to cutting properties, multi-layer coated cutting tools were produced and tested in a milling test. The cemented carbide substrates were the same as used above in example 1. In each case the multi-layer coating structures consisted of a total of seven layers, four of them were conventional TiAlN layers, alternating with inventive gamma-$Al_2O_3$ layers in the tool according to the invention, or with conventional $Al_2O_3$ layers in the comparative tool. The thicknesses of the layers corresponding to each other were the same in both sequences.

The TiAlN layers were each deposited in an Arc-PVD process at a total pressure of 10 Pa. The ratio Al/(Al+Ti) in the layers was 0.61 with 50 at. % nitrogen. The deposition conditions were adjusted to achieve the desired layer thicknesses.

In the layer sequence of the inventive tool, the $Al_2O_3$ layers were all prepared according to the present invention using the process parameters as described for sample #1 in example 1 above. In the layer sequence of the comparative tool, the $Al_2O_3$ layers were all prepared using the process parameters as described for sample #5 in example 1 above, whereby the substrate was three-fold rotated.

The layer structures were as follows:

| Layer # (from substrate) | Layer Thickness [μm] | Layer Composition |
|---|---|---|
| 1 | 4 μm | TiAlN |
| 2 | 0.5 μm | $Al_2O_3$ |
| 3 | 0.25 μm | TiAlN |
| 4 | 0.1 μm | $Al_2O_3$ |
| 5 | 0.25 μm | TiAlN |
| 6 | 0.1 μm | $Al_2O_3$ |
| 7 | 0.6 μm | TiAlN |

Using the above described tools, cutting tests were performed on a Heller FH 120-2 machine under the following conditions:

Cutting tests were performed on a Heller FH 120-2 machine under the following conditions.
Cutting Conditions:
Tooth Feed $f_z$ [mm/tooth]: 0.2
Feed $v_f$ [mm/min]: 120
Cutting speed $v_c$ [m/min]: 235
Cutting depth $a_p$ [mm]: 3
Workpiece material: 42CrMo4; tensile strength Rm: 950 N/mm$^2$ The following table 3 shows the results of the cutting tests, wherein $V_B$ is the minimum wear at the flank faces of the tool, $V_{Bmax}$ is the maximum wear, i.e. the deepest crater observed on the flank face of a tool, and VR is the wear at the cutting edge radius

TABLE 3

| Cutting length [mm] | Inventive Tool | | | Comparative Tool | | |
|---|---|---|---|---|---|---|
| | $V_B$ [mm] | $V_{Bmax}$ [mm] | $V_R$ [mm] | $V_B$ [mm] | $V_{Bmax}$ [mm] | $V_R$ [mm] |
| 800 | 0.02 | 0.02 | 0.02 | 0.02 | 0.03 | 0.03 |
| 1600 | 0.02 | 0.03 | 0.03 | 0.03 | 0.04 | 0.06 |
| 2400 | 0.02 | 0.05 | 0.04 | 0.04 | 0.06 | 0.08 |
| 3200 | 0.02 | 0.07 | 0.07 | 0.07 | 0.1 | 0.12 |
| 4000 | 0.02 | 0.10 | 0.10 | 0.10 | 0.12 | 0.17 |
| 4800 | 0.03 | 0.13 | 0.18 | 0.12 | 0.35 | 0.45 |

The results clearly show the advantageous behaviour of a cutting tool comprising at least one layer of $Al_2O_3$ according to the invention. In particular, the wear is considerably reduced with increasing cutting lengths.

The invention claimed is:
1. A process for manufacturing of a coated cutting tool consisting of a substrate and a single layer or multi-layer hard material coating, the substrate being selected from cemented carbide, cermet, ceramics, cubic boron nitride (cBN), polycrystalline diamond (PCD), steel or high-speed steel (HSS), and the hard material coating including at least one layer of gamma-$Al_2O_3$ being deposited by means of a reactive pulsed magnetron sputtering process using at least one Al target, wherein the at least one gamma-$Al_2O_3$ layer has a Vickers hardness HV(0.0015) of 3000 HV to 3500 HV, and wherein the deposition is carried out using a reaction gas composition comprising or consisting of argon (Ar) and oxygen ($O_2$) at a total reaction gas pressure within the range from at least 1 Pa to at most 5 Pa, at an $O_2$ partial pressure within the range from 0.001 Pa to 0.1 Pa, at a temperature within the range from 400° C. to 600° C., wherein a power density at the magnetron is from 4 to 20 W/cm², the bias voltage is from 80 V to 200 V and the bias current is from 20 A to 60 A.

2. The process according to claim 1, further comprising controlling the flow of oxygen during the deposition process in order to provide a substantially constant cathode voltage and/or substantially constant oxygen partial pressure.

3. The process according to claim 1, wherein the power density at the magnetron is from 6 to 13 W/cm².

4. The process according to claim 1, wherein the bias voltage is from 100 V to 180 V.

5. The process according to claim 1, wherein the reactive pulsed magnetron sputtering process has a pulse frequency within the range from 20 kHz to 100 kHz.

6. The process according to claim 1, wherein the bias current is from 26 A to 50 A.

7. The process according to claim 1, wherein a portion of the $O_2$ gas in the reactive gas composition is replaced by a nitrogen and oxygen containing gas, selected from nitrous oxide, $N_2O$, nitric oxide, NO, nitrogen dioxide, $NO_2$, and dinitrogen tetroxide, $N_2O_4$.

8. A coated cutting tool comprising a substrate and a single layer or multi-layer hard material coating, the substrate being selected from cemented carbide, cermet, ceramics, cubic boron nitride (cBN), polycrystalline diamond, steel or high-speed steel, and the hard material coating comprising at least one layer of gamma-$Al_2O_3$, wherein the at least one layer of gamma-$Al_2O_3$ is deposited by the process of claim 1.

9. A coated cutting tool comprising a substrate and a single layer or multi-layer hard material coating, the substrate being selected from cemented carbide, cermet, ceramics, cubic boron nitride (cBN), polycrystalline diamond (PCD), steel or high-speed steel (HSS), and the hard material coating comprising at least one layer of gamma-$Al_2O_3$, wherein the entire at least one gamma-$Al_2O_3$ layer has a Vickers hardness HV(0.0015) of 3000 HV to 3500 HV.

10. The coated cutting tool according to claim 9, wherein the at least one gamma-$Al_2O_3$ layer has a reduced Young's modulus of 350 GPa to 390 GPa.

11. The coated cutting tool according to claim 9, wherein the at least one gamma-$Al_2O_3$ layer is deposited directly onto the substrate.

12. The coated cutting tool according to claim 9, wherein at least one further layer of a nitride, carbide, carbonitride or boride of an element, selected from the group, consisting of Ti, Al, Cr, Si, V, Nb, Ta, W, Zr and Hf, is deposited between the substrate and the at least one gamma-$Al_2O_3$ layer and/or on top of the at least one gamma-$Al_2O_3$ layer.

13. The coated cutting tool according to claim 9, wherein the at least one gamma-$Al_2O_3$ layer has a thickness in the range from 0.3 μm to 20 μm.

14. The coated cutting tool according to claim 9, wherein the at least one layer of gamma-$Al_2O_3$ is deposited by a reactive pulsed magnetron sputtering process using at least one Al target, wherein the deposition is carried out using a reaction gas composition comprising or consisting of argon (Ar) and oxygen ($O_2$) at a total reaction gas pressure within the range from at least 1 Pa to at most 5 Pa, at an $O_2$ partial pressure within the range from 0.001 Pa to 0.1 Pa, at a temperature within the range from 400° C. to 600° C., wherein a power density at the magnetron is from 4 to 20 W/cm², the bias voltage is from 80 V to 200 V and the bias current is from 20 A to 60 A.

15. The process according to claim 5, wherein the reactive magnetron sputtering process is a bipolar pulsed magnetron sputtering process or HIPIMS.

16. The coated cutting tool according to claim 9, wherein the at least one gamma-$Al_2O_3$ layer has a reduced Young's modulus of 370 GPa to 390 GPa.

17. A coated cutting tool comprising a substrate and a single layer or multi-layer hard material coating, the substrate being selected from cemented carbide, cermet, ceramics, cubic boron nitride (cBN), polycrystalline diamond (PCD), steel or high-speed steel (HSS), and the hard material coating comprising at least one layer of gamma-$Al_2O_3$, wherein the at least one gamma-$Al_2O_3$ layer has a Vickers hardness HV(0.0015) of 3000 HV to 3500 HV and a reduced Young's modulus of 361 GPa to 390 GPa.

* * * * *